United States Patent
Wu et al.

(10) Patent No.: US 8,085,070 B2
(45) Date of Patent: Dec. 27, 2011

(54) OVERCLOCKING WITH PHASE SELECTION

(75) Inventors: Qichang Wu, Shanghai (CN); Shuo Liu, Shanghai (CN); Juan Qiao, Shanghai (CN)

(73) Assignee: Integrated Device Technology inc., San Jose, CA (US)

( * ) Notice: Subject to any disclaimer, the term of this patent is extended or adjusted under 35 U.S.C. 154(b) by 117 days.

(21) Appl. No.: 12/338,970

(22) Filed: Dec. 18, 2008

(65) Prior Publication Data

US 2009/0160509 A1    Jun. 25, 2009

Related U.S. Application Data

(60) Provisional application No. 61/008,813, filed on Dec. 20, 2007.

(51) Int. Cl.
*H03L 7/06* (2006.01)

(52) U.S. Cl. ......................................... 327/156; 327/147

(58) Field of Classification Search .................. 327/149, 327/158, 147, 156
See application file for complete search history.

(56) References Cited

U.S. PATENT DOCUMENTS

| | | | | |
|---|---|---|---|---|
| 5,233,425 A * | 8/1993 | Rabii | | 348/735 |
| 6,552,585 B2 * | 4/2003 | Poullet | | 327/115 |
| 6,738,449 B2 * | 5/2004 | Dalt | | 377/48 |
| 7,031,662 B2 * | 4/2006 | Suzuki et al. | | 455/63.1 |
| 7,365,580 B2 * | 4/2008 | Martin et al. | | 327/156 |
| 7,417,477 B2 * | 8/2008 | Koyama et al. | | 327/156 |
| 2002/0101955 A1 * | 8/2002 | Poullet | | 377/48 |
| 2003/0020523 A1 * | 1/2003 | Dalt | | 327/115 |
| 2006/0164132 A1 * | 7/2006 | Martin et al. | | 327/105 |
| 2007/0247233 A1 * | 10/2007 | Keaveney | | 331/1 A |
| 2009/0160509 A1 * | 6/2009 | Wu et al. | | 327/156 |
| 2010/0213984 A1 * | 8/2010 | Shin et al. | | 327/105 |

\* cited by examiner

*Primary Examiner* — Lincoln Donovan
*Assistant Examiner* — Adam Houston
(74) *Attorney, Agent, or Firm* — Hayes and Boone LLP

(57) ABSTRACT

A novel solution that combines the technologies of fractional divider and phase selection is provided to implement overclocking for CPU PLL in PC clock generator with a set resolution that is independent of the clock frequency.

9 Claims, 5 Drawing Sheets

OVERCLOCKING WITH PHASE SELECTION

RELATED APPLICATION

This application claims the benefit of priority to U.S. Provisional Patent Application No. 61/008,813, filed on Dec. 20, 2007, which is hereby incorporated by reference in its entirety.

BACKGROUND

1. Field of the Invention

The present invention is related to overclocking of a computer component and, in particular, to overclocking with phase selection for the central processing unit (CPU) phase-locked loop (PLL) with a particular resolution.

2. Discussion of Related Art

Overclocking can allow a user to increase the performance of a computer component, such as a CPU, by making the component run at a higher clock rate than it was designed or designated by the manufacturer. Some users overclock outdated components to keep pace with new system requirements, some purchase low-end computer components which they then overclock, and some overclock high-end components to attain levels of performance beyond the default factory settings.

Traditionally, the overclocking resolution may vary with output frequencies. So, the overclocking resolution may be 1 MHz-step only when the CPU output frequency is at one or two special values. For example, a user may be able to overclock a CPU running at a frequency of 133.333 MHz to 266.666 MHz, but the user may not be able to overclock the same CPU to 150 MHz without involving complex calculations. In other words, there is no simple way for a user to overclock a CPU with a 1 MHz-step resolution if the CPU frequency is not at a special value.

This presents a difficulty for users who wish to precisely overclock a CPU without performing complex calculations. And this may be especially problematic because a user may not be able to precisely overclock a CPU to take full advantage of many modern computer components that may operate or be operable at a higher frequency than the CPU. Currently, the modern technologies are unable to solve this difficulty.

Therefore, there is a need for a simpler overclocking procedure, which allows users to overclock CPUs at 1 MHz-step resolution.

SUMMARY

In accordance with embodiments of the present invention, a timing circuit or a timing circuit system is disclosed that includes a CPU PLL which provides a CPU clock signal, a phase selection circuit coupled to the CPU PLL, the phase selection circuit adjusting a fractional N-divider feedback circuit such that a step resolution is a particular value independently of the CPU output frequency. In some embodiments, the CPU clock signal provided by the timing circuit may be programmable by increments of 1 MHz by a user.

Consistent with some embodiments of the present invention, a method of generating a dividing value signal may include receiving an input value from a user, checking to ensure that a phase selection is enabled, checking a CPU frequency, changing a phase of at least one clock signal, and adjusting the input value from the user to provide a dividing value.

These and other embodiments will be described in further detail below with respect to the following figures.

Figure 1:
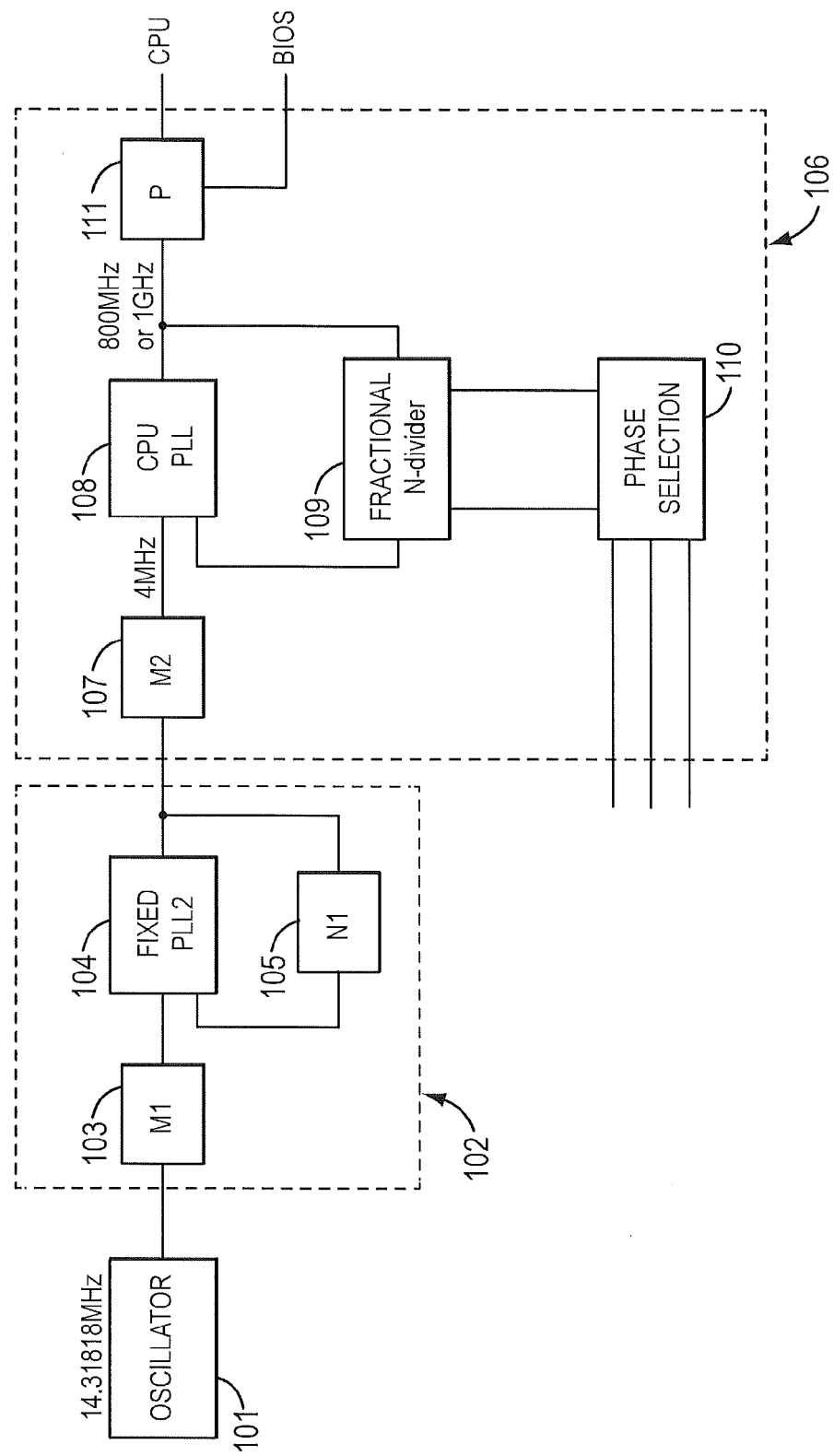
FIG. 1 illustrates a block diagram of a timing circuit consistent with some embodiment of the present invention.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

Some embodiments of the invention provide an improved timing circuit to allow a user to overclock a CPU with a particular resolution, for example a 1 MHz-step resolution, at all frequencies utilized by the CPU. The desired overclock value can be entered into the input/output system (BIOS) of a computer, without any calculation to determine the available resolution. In some embodiments, the timing circuit may include a CPU PLL, which is coupled to a phase selection circuit, the phase selection circuit adjusting a fractional N-divider feedback circuit. The output signals from the CPU PLL are input to a P-divider before the final clock signal is output to a CPU. The combination of the P-divider and the fractional N-divider is arranged such that the overclocking step resolution is a particular step resolution, for example 1 MHz, independently of the clock frequency output to the CPU.

Overclocking a CPU can be done by manipulating the CPU multiplier and a motherboard's front side bus speed until a maximum stable operating frequency is reached. A clock on a motherboard, also known as a system clock, can be generated by a crystal oscillator. Through the application of a voltage, the oscillator can use the resonance of a piezoelectric crystal to produce a very stable frequency. However, modern computer components rarely run at this frequency. Thus, in most cases, a CPU PLL circuit may need to be introduced to derive the speeds required for modern motherboard bus operation.

A CPU PLL circuit can be used to generate a signal with a fixed relation to the phase and frequency of an input reference signal by automatically raising or lowering the frequency of a controlled oscillator until it is matched to the reference in both frequency and phase. The output frequency of a CPU PLL signal can be fed through a frequency divider back to the input of the CPU PLL, creating a negative feedback loop. If the feedback output frequency departs from the reference signal, the error signal, which measure the difference between the feedback signal and the reference signal, increases or decreases, forcing the frequency to change in the opposite direction to reduce the error.

FIG. 1 shows a block diagram of a timing circuit consistent with some embodiment of the present invention. As shown in FIG. 1, the output of an oscillator 101 is coupled to the input of a fixed PLL2 circuit 102. Fixed PLL2 circuit 102 includes a divider M1 103, a fixed PLL2 104, and a divider N1 105. The output of fixed PLL2 circuit 102 is coupled to the input of a CPU PLL circuit 106. CPU PLL circuit includes a divider M2 107, a CPU PLL 108, a fractional N-divider 109, a phase selection block 110, and a P-divider 111.

Figure 2:
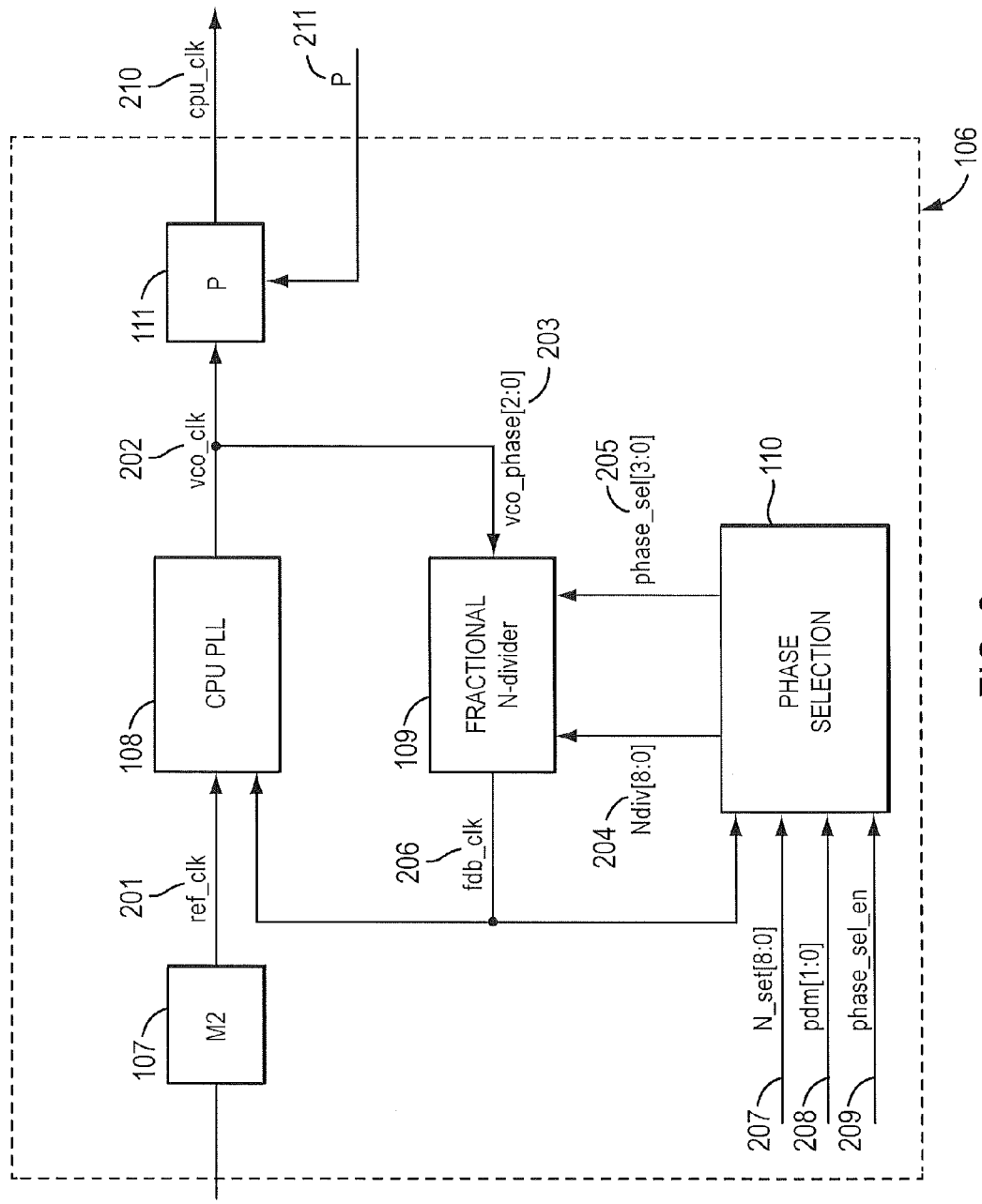
FIG. 2 illustrates a CPU PLL circuit consistent with some embodiment of the present invention.

FIG. 2 shows a CPU PLL circuit 106 consistent with some embodiment of the present invention. As shown in FIG. 2, CPU PLL 108 generates a vco_clk signal 202 in response to a ref_clk signal 201 and a fdb_clk signal 206, which is generated by fractional N-divider 109. P-divider 111 divides vco_clk signal 202 by a value P in P-divider 111. The value P can be input, for example, from the BIOS and is dependent on the output clock frequency. The output signal vco_clk 202 includes clocks of, for example, three phases, vco_phase[2:0] 203, all having the same frequency. The vco_clk 202 is divided by N in fractional N-divider 109 to generate the feedback clock fdb_clk 206.

As shown in FIG. 2, the signals Ndiv[8:0] 204 and phase_sel[3:0] 205 are generated by phase selection circuit 110 in response to the signals N_set[8:0] 207, pdm[1:0] 208, and phase_sel_en 209. In a typical example, where the CPU frequency, for example, can be, for example, 100 MHz, 133.333 MHz, 166.666 MHz, 200 MHz, 266.666 MHz, 333.333 MHz, and 400 MHz without overclocking, the fraction can be 0.333 or 0.666. Table 1 illustrates the relationship between phase_sel_en 209, pdm[1:0] 208, N_set[8:0] 207, and the signals Ndiv[8:0] 204 and phase_sel[3:0] 205 in some examples of the invention.

TABLE 1

Control signals for fractional N-divider

| phase_sel_en | pdm[1:0] | phase_sel[3:0] | Ndiv[8:0] | fractional N |
|---|---|---|---|---|
| 0 | X | 4'b0001 | N_set | 0 |
| 1 | 2'b00 | 4'b0001 | N_set | 0 |
| 1 | 2'b01 | 4'b0001, | N_set − 1, | N.3 |
|   |   | 4'b0010, | N_set − 1, |   |
|   |   | 4'b0100 | N_set + 3 |   |
| 1 | 2'b10 | 4'b0001, | N_set − 2, | N.6 |
|   |   | 4'b0100, | N_set + 2, |   |
|   |   | 4'b0010 | N_set + 2 |   |
| 1 | 2'b11 | 4'b0001, | N_set − 2, | N.5 |
|   |   | 4'b1000 | N_set + 3 |   |

As can be seen in Table 1, Ndiv[8:0] 204 and phase_sel[3:0] 205 are set to produce a feedback clock fdb_clk 206 appropriate for the particular situation. As shown, if phase_sel_en 209 is off (set to 0), then Ndiv[8:0] 204 is set to N_set[8:0] 207 and phase_sel[3:0] 205 is set to binary "0001". If phase_sel_en 209 is on (set to 1), but the fraction part is 0 (shown as pdm[1:0] 208 equal to binary "00"), then Ndiv[8:0] 204 is again set to N_set[8:0] 207 and phase_sel[3:0] 205 set to binary "0001". If the fraction part is 0.333 as indicated by pdm[1:0] 208 being set to binary "01," then Ndiv[8:0] 204 and phase_sel[3:0] 205 are rotated between values as shown in Table 1. Similar settings are rotations can be provided by the fractional part being 0.666 or 0.5, as illustrated in Table 1.

Figure 3:
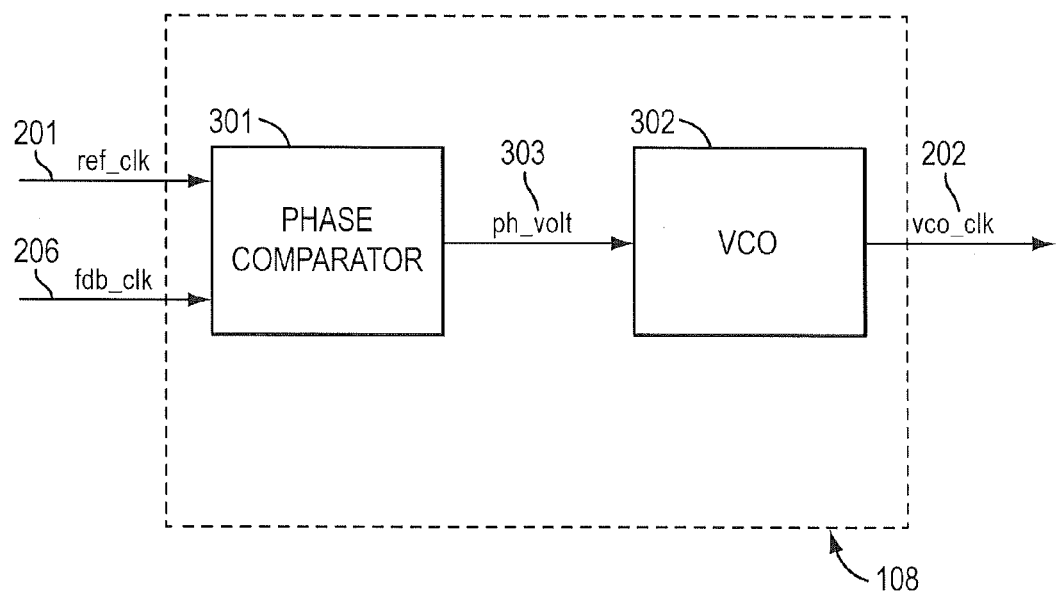
FIG. 3 illustrates a CPU PLL consistent with some embodiment of the present invention.

FIG. 3 shows an example of CPU PLL 108. As shown in FIG. 3, a phase comparator 301 is coupled to a VCO 302. Phase comparator 301 generates a voltage signal, ph_volt 303, that is adjusted in response to a comparison between ref_clk 201 and fdb_clk 206. VCO 302 generates vco_clk 202 in response to the signal ph_volt 303 generated by phase comparator 301. One skilled in the art will recognize that CPU PLL 108 may, itself, contain another PLL with a fixed divider feedback loop.

Figure 4:
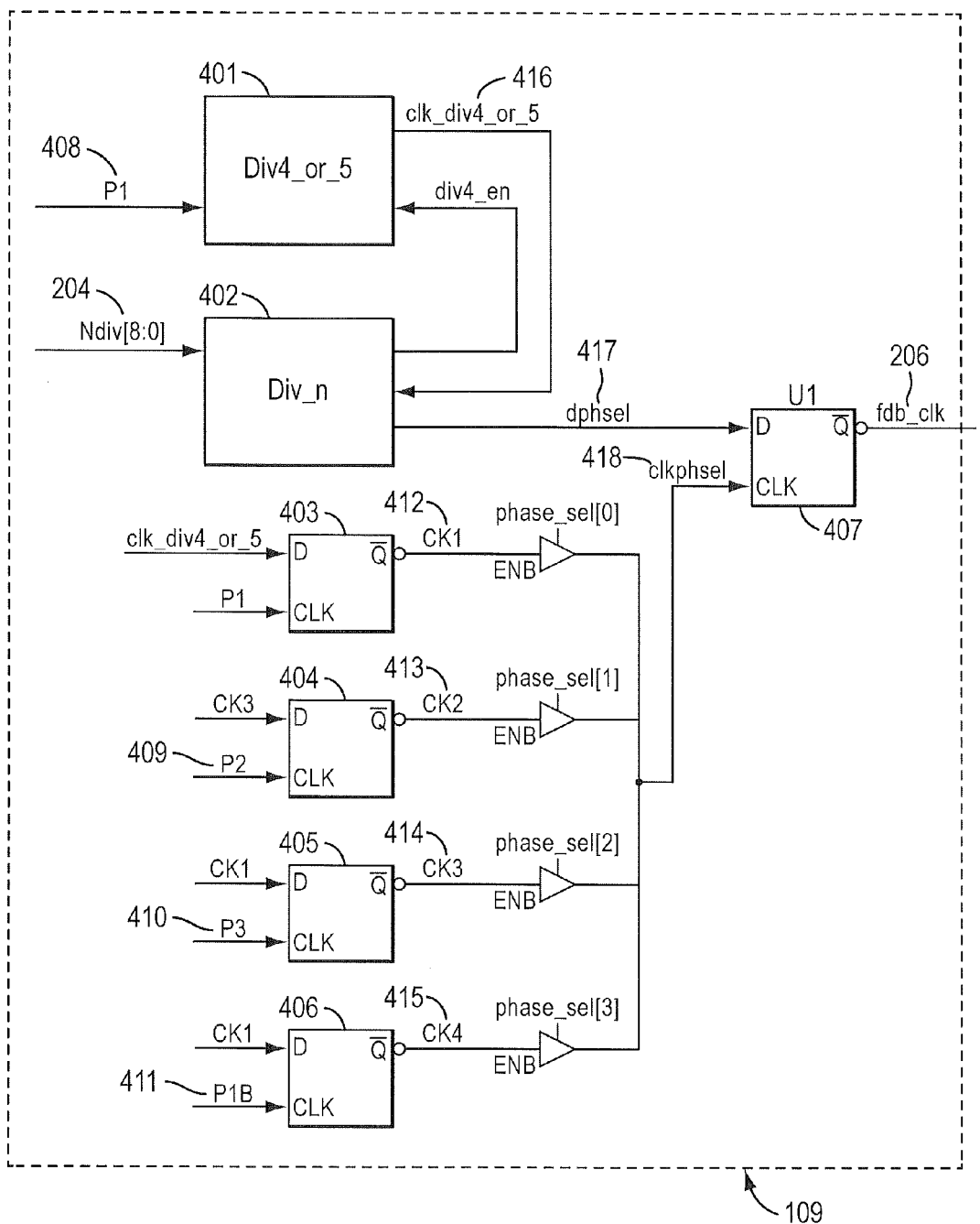
FIG. 4 illustrates a fractional N-divider consistent with some embodiment of the present invention.

FIG. 4 shows a fractional N-divider 109 consistent with some embodiment of the present invention. As shown in FIG. 4, fractional N-divider 109 includes a Div4_or_5 block 401, a Div_n block 402 and five D-Q flip-flops 403-407. Div4_or_5 block 401 receives a P1 signal 408, which is a first phase of vco_clk signal 202. A clk_div4_or_5 signal 416 is P1 signal 408 divided by 4 or 5 according to the div4 en signal 419 generated from the Ndiv[8:0] signal 204 by a Div_n block 402. Div4_or_5 block 401 is a preliminary divider for vco_clk 202, where N=n*4+m, n=Ndiv[8:2], and m=Ndiv[1:0]. After a simple transform, N=n*4+m*(5−4)=(n−m)*4+m*5. Div4_or_5 block 401 can be a dynamic divider for high frequency. Div_n block 402 periodically receives a Ndiv[8:0] 204 signal from phase selection circuit 110 and clk_div4_or_5 signal 416 from Div4_or_5 block 401. Div_n block 402 then generates a dphsel signal 417, which is vco_clk signal 202 divided by N. Div_n block 402 also divides clk_div4_or_5 416 by Ndiv[8:2] 204.

Further as shown in FIG. 4, in some embodiments, VCO 302 provides three differently-phased clock signals, vco_clk[2:0] 203, which are denoted P1 408, P2 409, and P3 410, respectively. With signal P1 408 as the reference signal, signal P2 409 lags signal P1 408 by 120 degrees while signal P3 410 lags signal P1 409 by 240 degrees. P1B 411 is the inverse of signal P1 408. D-Q flip-flop 403 receives clk_div4_or_5 416 and P1 408 and generates CK1 signal 412, which is the inverse of sync to clk_div4_or_5 416 by P1 408. D-Q flip-flop 404 receives CK3 414 and P2 409 and generates CK2 signal 413, which is the inverse of sync to CK3 414 by P2 409. D-Q flip-flop 405 receives CK1 412 and P3 410 and generates CK3 signal 414, which is the inverse of sync to CK1 412 by P3 410. D-Q flip-flop 406 receives CK1 412 by P1B 411 and generates CK4 signal 415, which is the inverse of sync to CK1 412 by P1B 411. clkphsel signal 418 is a clock signal selected from CK1 412, CK2 413, CK3 414, and CK4 415 according to phase_sel[3:0] 205 signal from phase selection block 110. D-Q flip flop 407 receives dphsel signal 417 and clkphsel signal 418 and generates fdb_clk signal 105, which gets fed back to CPU PLL 108 and phase selection circuit 110.

Figure 5:
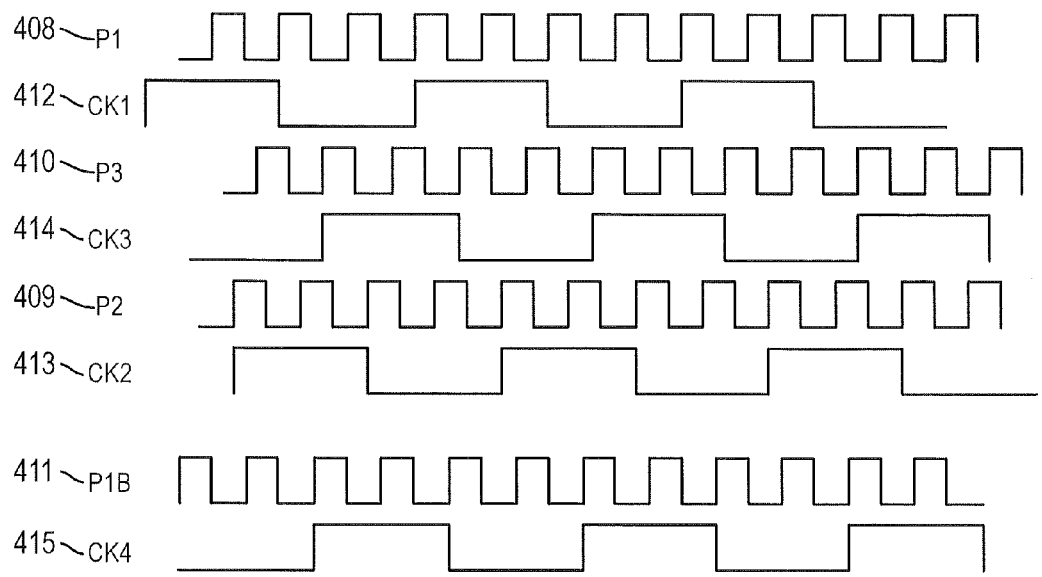
FIG. 5 illustrates a phase selection timing diagram consistent with some embodiment of the present invention.
Figure 6:
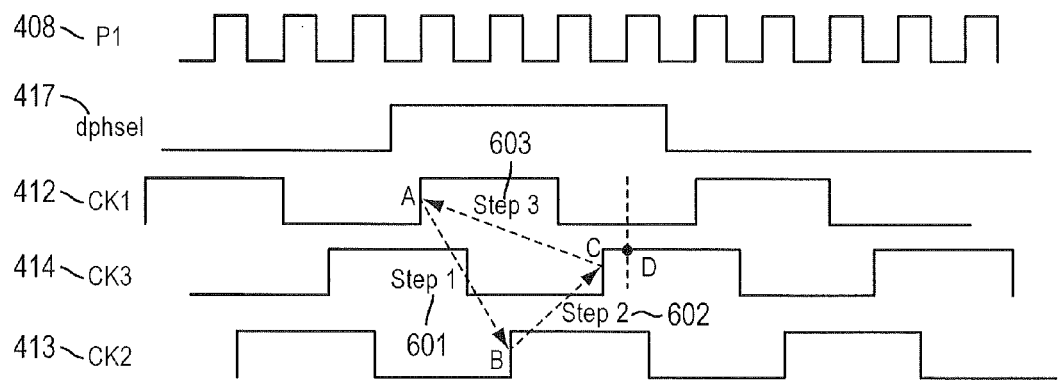
FIG. 6 illustrates a phase selection timing diagram and the steps involved in the phase switching loop consistent with some embodiment of the present invention.

FIGS. 5 and 6 illustrate the timing operation of fractional N-divider 109 as shown in FIG. 4. FIG. 5 illustrates a phase selection timing diagram with a VCO period of $T_{vco}$ consistent with some embodiment of the present invention. FIG. 5 shows three VCO clock signals with different phases P1 408, P2 409, P3 409, and four clock signals, CK1 412, CK2 413, CK3 414, and CK4 415. The adjacent skew is $4*T_{vco}/3$. CK4 415 lags CK1 412 by $2.5*T_{vco}$. When 0.333 or 0.666 phase selection is implemented, clkphsel 418 is selected from CK1 412, CK2 413, and CK3 414. When 0.5 is implemented, clkphsel 418 is selected from CK1 412 and CK4 415. Phase selection circuit 110 will generate Ndiv[8:0] 204 according to phase_sel signal 205. The functionality of phase selection circuit 110 is discussed above with respect to Table 1.

FIG. 6 shows a 0.333 phase selection timing diagram and the steps involved in the phase switching loop consistent with some embodiment of the present invention. FIG. 6 shows the relationship between dphsel 417, clock signals, CK1 412, CK2 413, CK3 414, and VCO clock signal P1 408. When implementing a 0.333 phase selection, there are three steps in phase switching loop, as illustrated in FIG. 6.

First 601, the phase is increased by $1.333*T_{vco}$ from point A to point B, so N_set minus 1 is implemented to obtain $0.333*T_{vco}$ phase increment. Second 602, the phase is increased by $1.333*T_{vco}$ from point B to point C, so N_set minus 1 is implemented to obtain $0.333*T_{vco}$ phase increment. Third 603, the phase is decreased by $2.666*T_{vco}$ from point C to point A, so N_set plus 3 is implemented to obtain $0.333*T_{vco}$ phase increment, that is, delay sampling at point A to point D.

In some examples, oscillator 101 shown in FIG. 1 may operate at 14.3181 MHz. However, modern computer components rarely run at this frequency. Thus, fixed PLL circuit 102, can be used to derive a reference clock signal, ref_clk 201, that can be utilized for modern motherboard bus operation. In some embodiments, ref_clk 201 can be a 4 MHz clock.

Then, CPU PLL circuit 106 can then be utilized to overclock a CPU. As shown in FIG. 3, a phase comparator 301 receives two input signals, ref_clk 201 and fdb_clk 206. phase comparator 301 compares the frequency and phase of the input signals and generates a voltage signal, ph_volt 303, based on the difference of the two input signals. VCO 302 then changes the frequency and phase of vco_clk signal 202 such that the change is proportional to the change in ph_volt signal 303. If the input signals are the same value, phase comparator 301 continues to output the same ph_volt 303 and VCO 302 keeps oscillating at a fixed rate. As shown in FIG. 2, the output signal vco_clk 202 from CPU PLL 108 is input to P-divider 111, which again divides the output frequency vco_clk 202 by the value P.

The overclocking resolution for CPU PLL 106 shown in FIG. 2 can be defined by the equation $$\left(\frac{N_{actual} * \text{ref\_clk}}{P}\right) / N,$$

where $N_{actual}$ is the actual CPU frequency output by CPU PLL 106, N is a dividing value used by fractional N-divider, which is set by N_set[8:0] 207, ref_clk 201 is the reference signal frequency, and P is the dividing value hardcoded into P 111.

Typically, a CPU PLL circuit 106 supports several frequencies utilized by a CPU, for example some CPUs can support clock frequencies of 100 MHz, 133.333 MHz, 166.666 MHz, 200 MHz, 266.666 MHz, 333.333 MHz, and 400 MHz. The signal ref_clk 201 from divider M1107 is typically fixed to 4 MHz. The value of P 111 is hardcoded with either 4 or 2 depending, on the CPU frequency. In some embodiments, the value P in P-divider 111 can be 4 when the CPU frequency is 100 MHz, 133.333 MHz, 166.666 MHz, 200 MHz, or 266.666 MHz and 2 when the CPU frequency is 333.333 MHz or 400 MHz. The value of N is equal to $N_{actual}$ when P is 4, and N value is equal to $N_{actual}*2$ when P is 2. vco_clk 202 frequency is typically between 800 MHz and 1 GHz, therefore a high frequency VCO is not generally necessary to support VCO frequencies.

Some examples are illustrated below with the following parameters: ref_clk=4 MHz; CPU frequency 100 MHz~266.666 MHz; P=4; VCO frequency=400 MHz~1066.666 MHz. For example, suppose that the CPU frequency is at 133.333 MHz. If there is overclocking not enabled, $N_{actual}$=133.333 MHz=N=133+0.333 MHz, and thus, 0.333 will be implemented by phase selection circuit 110. As a result, the resolution will be 1 MHz, the output frequency from CPU PLL 108 will be 533.33 MHz, and the output CPU frequency will be 133.333 MHz. The same result would occur if overclocking is enabled but N value is not written. The default frequency will be 133.333 MHz when Trust Mode Enable (TME) is zero, that is overclocking will be disabled at power on. However, if the overclocking is enabled and N value has been specified, in some cases phase selection circuit 110 can be turned off by setting phase_sel_en 209 to 0. Thus, if N value is 150, N_set=150, and the CPU frequency will be 150 MHz.

However, when the CPU frequency is 333.333 MHz or 400 MHz, the phase selection circuit will not be turned off when the overclocking has been enabled and N value has been written. If the CPU frequency is 333.333 MHz or 400 MHz, VCO frequency will need to be 1.333 GHz or 1.6 GHz, which is too high. Thus, as mentioned above, P will be set to 2. However, the resolution is then 2 MHz. However, the 0.5 phase selection option shown in Table 1 can be implemented in phase selection circuit 110 and N_set[8:0] 207 to $2*N_{actual}$.

For example, suppose that CPU frequency is 333.333 MHz. When overclocking is not enabled and when $N_{actual}$ is 166.666 MHz, N=166+0.666 MHz, and thus, 0.666 will be implemented by phase selection circuit. Plugging the values into the above equation for resolution, the resolution will be 1 MHz. And the output CPU frequency will be 166.666*2=333.333 MHz.

The same result would occur if overclocking is enabled but N value is not written. However, when overclocking is enabled and N value has been written, three phase selection will not be turned off but a 0.5 phase selection will be implemented. For example, if N value is 351, $N_{actual}$ will be 351/2=175.5=N=175+0.5, thus, 0.5 phase selection will be implemented. As a result, the CPU output frequency will be 351 MHz.

Table 2 below shows the relationship between the CPU frequency, VCO frequency, N, $N_{actual}$, P, and phase selections in some embodiments of the invention.

TABLE 2

| | PLL1 | | | | phase selection loop | |
|---|---|---|---|---|---|---|
| Freq | VCO | N2 | Actual N2 | P2 | No Overclocking | Overclock |
| 100 | 400 | 100 | (N)100 | 4 | 0 | 0 |
| 133 | 533.33 | 133.33 | (N)133.33 | 4 | 0, ⅓, ⅔ | 0 |
| 166 | 666.66 | 166.66 | (N)166.66 | 4 | 0, ⅓, ⅔ | 0 |
| 200 | 800 | 200 | (N)200 | 4 | 0 | 0 |
| 266 | 1066.66 | 266 | (N)266.66 | 4 | 0, ⅓, ⅔ | 0 |
| 333 | 666.66 | 333.33 | (N/2)166.66 | 2 | 0, ⅓, ⅔ | 0, 0.5 |
| 400 | 800 | 400 | (N/2)200 | 2 | 0 | 0, 0.5 |

The examples provided above are exemplary only and are not intended to be limiting. One skilled in the art may readily devise other overclocking circuits consistent with embodiments of the present invention which are intended to be within the scope of this disclosure. For example, one skilled in the art may devise circuit for a less than 1 MHz-step or a greater than 1 MHz-step overclocking with phase selection for the CPU PLL, which are within the scope of this disclosure and consistent with the embodiments of the present invention. As such, the application is limited only by the following claims.

What is claimed is:
1. A timing circuit comprising:
   a CPU phase-locked loop (PLL) which provides a CPU clock signal with an overclocking step resolution that is not a multiple of the CPU output frequency and is implemented in circuitry according to the following equation:

$$((N_{actual} * \text{ref\_clk})/P)/N$$

where $N_{actual}$ is an actual CPU frequency output by the CPU PLL, ref_clk is a reference clock received by the CPU PLL, P is a dividing value used by a P-divider, and N is a dividing value used by a fractional N-divider; and a phase selection circuit that provides control signals to the fractional N-divider in response to input signals;

wherein the fractional N-divider is coupled to receive the VCO clock signal and provides a feedback clock;

wherein the P-divider provides the CPU clock signal based on the VCO clock signal;

wherein the CPU PLL receives the reference clock and the feedback clock and outputs a VCO clock signal in response to a comparison between the reference clock and the feedback clock; and wherein the value P of the P-divider and the input signals to the phase selection circuit are chosen so that the step resolution is fixed while the VCO clock signal has a frequency less than a set frequency.

2. The circuit in claim 1, wherein the control signals include a dividing value signal (Ndiv[8:0]) and a phase selection signal (phase_sel[3:0]).

3. The circuit in claim 2, wherein the VCO clock signal includes three differently-phased clock signals equally separated in phase.

4. The circuit of claim 1, wherein P is 4 for frequencies less than about 267 MHz and 2 for frequencies greater than about 267 MHz, and wherein the set frequency is about 1 GHz.

5. A method of providing a clock frequency with an overclocking step resolution that is not a multiple of the clock frequency, comprising:

generating a VCO clock signal with a CPU PLL with a fractional N-divider feedback circuit;

frequency dividing the VCO clock signal by P in a P-divider;

setting P and parameters to the fractional N-divider in relation to the clock frequency in order to obtain the overclocking step resolution while keeping a frequency of the VCO clock signal below a set frequency.

6. The method of claim 5, wherein the overclocking step resolution is 1 MHz.

7. The method of claim 5, wherein the set frequency is about 1 GHz.

8. The method of claim 7, wherein P is set to 4 for frequencies less than about 267 MHz and set to 2 for frequencies greater than about 267 MHz.

9. The method of claim 8, wherein an N value of the fractional N-divider is adjusted according to the value of P.

* * * * *